United States Patent
Fragapane et al.

(10) Patent No.: US 9,461,130 B2
(45) Date of Patent: Oct. 4, 2016

(54) ELECTRONIC DEVICE COMPRISING CONDUCTIVE REGIONS AND DUMMY REGIONS

(71) Applicant: STMicroelectronics S.r.l., Agrate Brianza (IT)

(72) Inventors: Leonardo Fragapane, Catania (IT); Antonino Alessandria, Catania (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 14/972,794

(22) Filed: Dec. 17, 2015

(65) Prior Publication Data

US 2016/0111507 A1    Apr. 21, 2016

Related U.S. Application Data

(62) Division of application No. 14/150,264, filed on Jan. 8, 2014, now Pat. No. 9,306,029.

(30) Foreign Application Priority Data

Jan. 11, 2013 (IT) .............. MI2013A0030

(51) Int. Cl.
| | |
|---|---|
| H01L 21/332 | (2006.01) |
| H01L 29/423 | (2006.01) |
| H01L 29/739 | (2006.01) |
| H01L 29/40 | (2006.01) |
| H01L 29/66 | (2006.01) |
| H01L 29/78 | (2006.01) |
| H01L 29/10 | (2006.01) |

(52) U.S. Cl.
CPC ......... *H01L 29/4236* (2013.01); *H01L 29/401* (2013.01); *H01L 29/66348* (2013.01); *H01L 29/7397* (2013.01); *H01L 29/1095* (2013.01); *H01L 29/66666* (2013.01); *H01L 29/66734* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 7,977,704 B2 | 7/2011 | Koyama et al. | |
| 2007/0023828 A1* | 2/2007 | Kawamura | ......... H01L 29/4236 257/330 |
| 2009/0283797 A1 | 11/2009 | Takahashi et al. | |
| 2013/0285140 A1 | 10/2013 | Kagawa et al. | |
| 2014/0084333 A1* | 3/2014 | Nakamura | ......... H01L 29/66348 257/139 |

FOREIGN PATENT DOCUMENTS

| | | |
|---|---|---|
| WO | WO-2011111500 A1 | 9/2011 |
| WO | WO-2012077617 A1 | 6/2012 |

OTHER PUBLICATIONS

Italian Search Report and Written Opinion for IT MI2013A000030 mailed Sep. 18, 2013 (8 pages).

* cited by examiner

*Primary Examiner* — Thanh T Nguyen
(74) *Attorney, Agent, or Firm* — Gardere Wynne Sewell LLP

(57) ABSTRACT

A device includes an epitaxial region extending into a front surface of a chip. A portion of the chip adjacent the epitaxial region defines a collector. A gate is provided in a trench extending into the epitaxial region from the front surface. An emitter includes a body extending into the epitaxial region at a first side of the trench and a source extending into the body region from the front surface at the trench. A dummy emitter extends into the epitaxial region from the front surface at a second side of the trench opposite said first side. The dummy emitter lacks the source. The gate extends along a first wall of the trench facing the emitter region. A dummy gate is formed in the trench in a manner electrically isolated from the gate and extending along a second wall of the trench opposite said first wall.

15 Claims, 6 Drawing Sheets

ELECTRONIC DEVICE COMPRISING CONDUCTIVE REGIONS AND DUMMY REGIONS

CROSS-REFERENCE TO RELATED APPLICATIONS

This application is a divisional application from U.S. application patent Ser. No. 14/150,264 filed Jan. 8, 2014, which claims priority from Italian Application for Patent No. MI2013A000030 filed Jan. 11, 2013, the disclosures of which are incorporated by reference.

TECHNICAL FIELD

The present invention generally relates to the field of semiconductor devices. More particularly, it relates to semiconductor devices comprising IGBT ("Insulated Gate Bipolar Transistor") transistors.

BACKGROUND

Each IGBT transistor integrated in a chip of semiconductor material comprises a collector region at a rear surface of the chip, an emitter region at a front surface of the chip opposite the rear surface, an epitaxial region between the emitter region and the collector region, and a gate region in an isolated trench extending into the chip from the front surface (through the emitter region and a part of the epitaxial region).

As should be known, the emitter region comprises a body region formed in the epitaxial region, and two source regions extending from the front surface into the body region along opposite side walls of the trench.

Therefore, each IGBT transistor has a BJT element (defined by the body region, the epitaxial region and the collector region) and a MOSFET element (defined by the source regions, the gate region, the body region and the epitaxial region).

When a driving voltage is applied to the gate region, a channel current flows along the side walls of the trench, between the source region and the epitaxial region (which thus acts as drain region of the MOSFET element). Then, a collector current, amplified by the gain factor of the BJT element with respect to the channel current, flows toward the collector region (so that the epitaxial region also acts as base region of the BJT element connected to the drain region of the MOSFET element).

As combining the properties of high impedance of the gate region of the MOSFET elements and of high collector current of the BJT elements, while requiring reduced area occupation, the IGBT transistors may be used in power applications (for example, for motor control).

In such applications, the IGBT transistors are integrated in large numbers in the chip. In order to achieve high integration density and performance, the IGBT transistors may be arranged in the chip according to suitable configurations. In a typical configuration, the IGBT transistors are arranged in (e.g., strips of) cells, hereinafter active cells, alternating to (e.g., strips of) dummy cells. Each active cell has two gate regions, an emitter region between the gate regions (and comprising two source regions, each one associated to a respective gate region), an epitaxial region and a collector region, whereas each dummy cell comprises two dummy gate regions (and/or a gate region and a dummy gate region, as discussed below), a dummy emitter region between the dummy gate regions, a dummy epitaxial region and a dummy collector region.

The dummy emitter regions are not provided with the source regions, so that the dummy cells do not implement the MOSFET element. As should be known, by properly driving the dummy cells, controlled voltage changes can be induced such as to affect electrical parameters of neighboring active cells (for example, breakdown voltage, gain factor). Thus, such electrical parameters can be controlled downstream of the production process, which gives greater design freedom.

In the state of the art, different solutions for driving the dummy cells exist.

Some solutions provide for connecting the dummy gate regions to the gate regions or the emitter regions, and to leave the dummy emitter regions floating. However, the driving of the dummy gate regions together with the driving of the gate regions (or of the emitter regions) does not provide satisfactory results.

Other solutions provide then to connect the dummy gate regions to each other, and to drive them independently with respect to the gate regions. In such solutions, the dummy emitter regions may be connected to the dummy gate regions, and driven together (or let both floating). Alternatively, as illustrated in U.S. Pat. No. 7,977,704 (the disclosure of which is incorporated by reference), some dummy emitter regions may be connected to the dummy gate regions, and driven independently from the remaining dummy emitter regions.

However, even such solutions do not provide satisfactory results. Indeed, the gate regions of the active cells also identify the dummy gate regions of the dummy cells adjacent thereto. This generates non-optimal biasing of the dummy cells.

These problems are exacerbated in single dummy cell implementations. In such implementations, in fact, each dummy cell is identified by both the gate regions of the active cells adjacent thereto.

Finally, in all the discussed solutions the dummy cells introduce capacitive couplings between the dummy emitter and dummy collector regions and the gate region of the active cells adjacent thereto. Such capacitive couplings determine a reduction of the switching speed of the active cells.

SUMMARY

In its general terms, the solution according to one or more embodiments is based on the idea of making (separated) gate and dummy gate regions within the same trench.

In particular, one or more aspects of the solution according to specific embodiments are set out in the independent claims, with advantageous features of the same solution that are indicated in the dependent claims, with the wording of all the claims that is incorporated herein verbatim by reference (with any advantageous feature being provided with reference to a specific aspect of the solution according to an embodiment of the invention that applies mutatis mutandis to any other aspect thereof).

More specifically, an aspect of the solution according to an embodiment proposes a power electronic device comprising an epitaxial region, a collector region, a gate region formed within a trench extending into the epitaxial region, an emitter region in the epitaxial region at a side of the trench (and comprising a body region and a source region in the body region), and a dummy emitter region (without source regions) in the epitaxial region at an opposite side of the trench. The gate region extends along a first wall of the trench facing the emitter region. The trench comprises a dummy gate region electrically isolated from the gate region and extending along a second wall of the trench opposite the first wall.

Another aspect of the solution according to an embodiment relates to a method for making such electronic device.

BRIEF DESCRIPTION OF THE DRAWINGS

A solution according to one or more embodiments, as well as further features and the advantages thereof, will be best understood with reference to the following detailed description, given purely by way of a non-restrictive indication, to be read in conjunction with the accompanying drawings (wherein, for the sake of ease, corresponding elements are denoted with equal or similar references, and their explanation is not repeated for the sake of brevity). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION OF THE DRAWINGS

Figure 1:
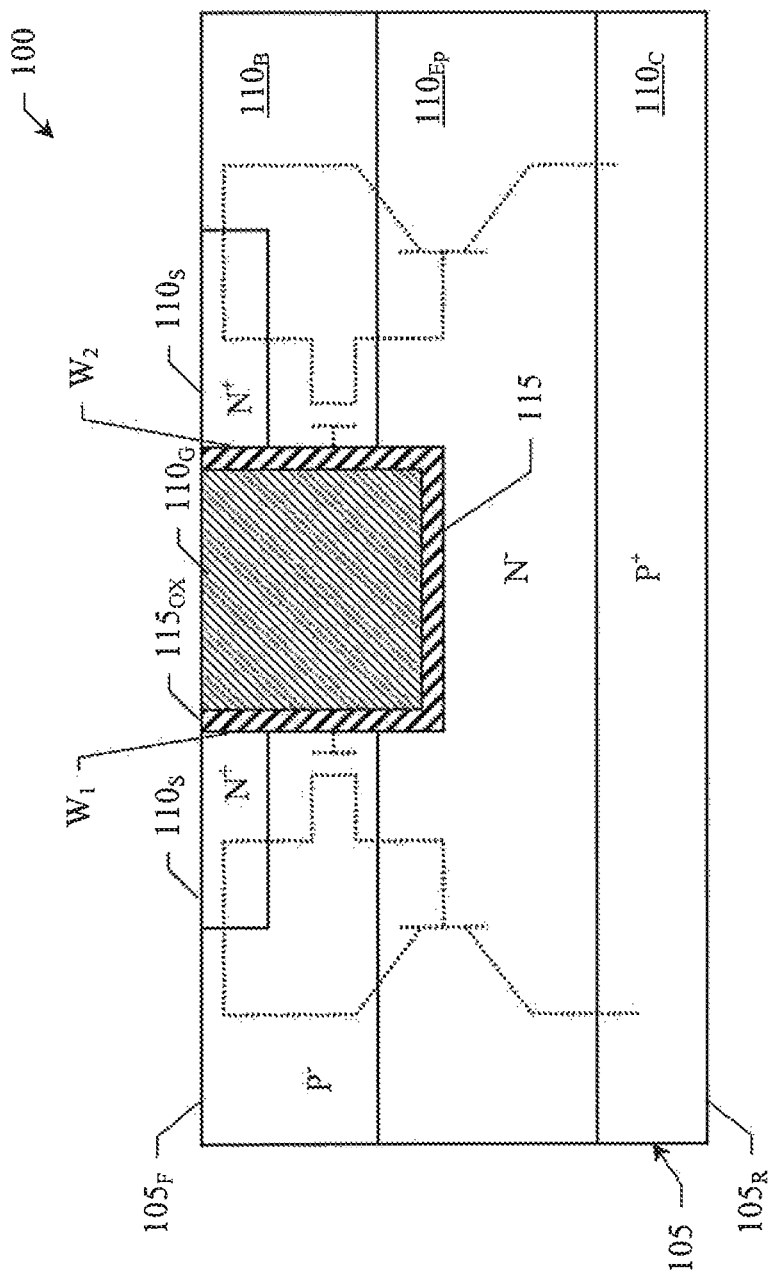
FIG. 1 schematically shows a sectional view of an IGBT transistor known in the state of the art.

With reference to FIG. 1, it schematically shows a sectional view of an IGBT transistor 100 known in the state of the art.

The IGBT transistor 100 is integrated in a chip 105 of semiconductor material of the P$^+$ type (for example, boron-doped silicon), which has a front surface $105_F$ and a rear surface $105_R$ opposite the front surface $105_F$. As usual, the addition the signs +/++ or −/−− to the letters P and N denotes high/very high or low/very low dopant concentrations, respectively, whereas the absence of any signs denotes intermediate dopant concentrations.

The IGBT transistor 100 comprises an epitaxial region $110_{Ep}$ of the N$^-$ type (for example, phosphorus-doped silicon) extending from the front surface $105_F$ into the chip 105, and a body region $110_B$ of P$^-$ type extending into the epitaxial region $110_{Ep}$ from the front surface $105_F$—with such a chip 105 that defines, between the epitaxial region $110_{Ep}$ and the rear surface $105_R$, a corresponding collector region $110_C$.

The IGBT transistor 100 also comprises a gate region $110_G$ formed in a trench 115 extending from the front surface $105_F$ through the body region $110_B$ and a part of the epitaxial region $110_{Ep}$, and two source regions $110_S$ of the N$^+$ type extending into the body region $110_B$ from front surface $105_F$ (at respective opposite side walls $W_1$, $W_2$ of the trench 115). The gate region $110_G$ comprises (e.g., N$^+$-doped) polycrystalline silicon, and is isolated from the source regions $110_S$, from the body region $110_B$ and from the epitaxial region $110_{Ep}$ by interposition of an oxide layer $115_{OX}$ (hereinafter, the gate region, the trench and the oxide layer as a whole will be referred to as gate structure).

Therefore, as visible in the figure, the IGBT transistor 100 has a BJT element (defined by the body region $110_B$, the epitaxial region $110_{Ep}$ and the collector region $110_C$) and a MOSFET element (defined by the source regions $110_S$, the gate region $110_G$, the body region $110_B$ and the epitaxial region $110_{Ep}$).

When a driving voltage (not shown) is applied to the gate region $110_G$, a channel current flows along the side walls $W_1$, $W_2$ of the trench 115, between the source regions $110_S$ and the epitaxial region $110_{Ep}$ (which thus acts as drain region of the MOSFET element). Then, a collector current, amplified by the gain factor of the BJT element with respect to the current channel, flows toward the collector region $110_C$ (so that the epitaxial region $110_{Ep}$ also acts as base region of the BJT element connected to the drain region of the MOSFET element). The body region $110_B$ and the source regions $110_S$, biased in the same way, instead identify an emitter region $110_B$, $110_S$ of the IGBT transistor 100 (with the body region $110_B$ that acts also as emitter region of the BJT element).

Therefore, as shown in the equivalent circuit diagram of the IGBT transistor 100, the emitter region and the base region of the BJT element are connected to the source region and the drain region, respectively, of the MOSFET element.

Figure 2:
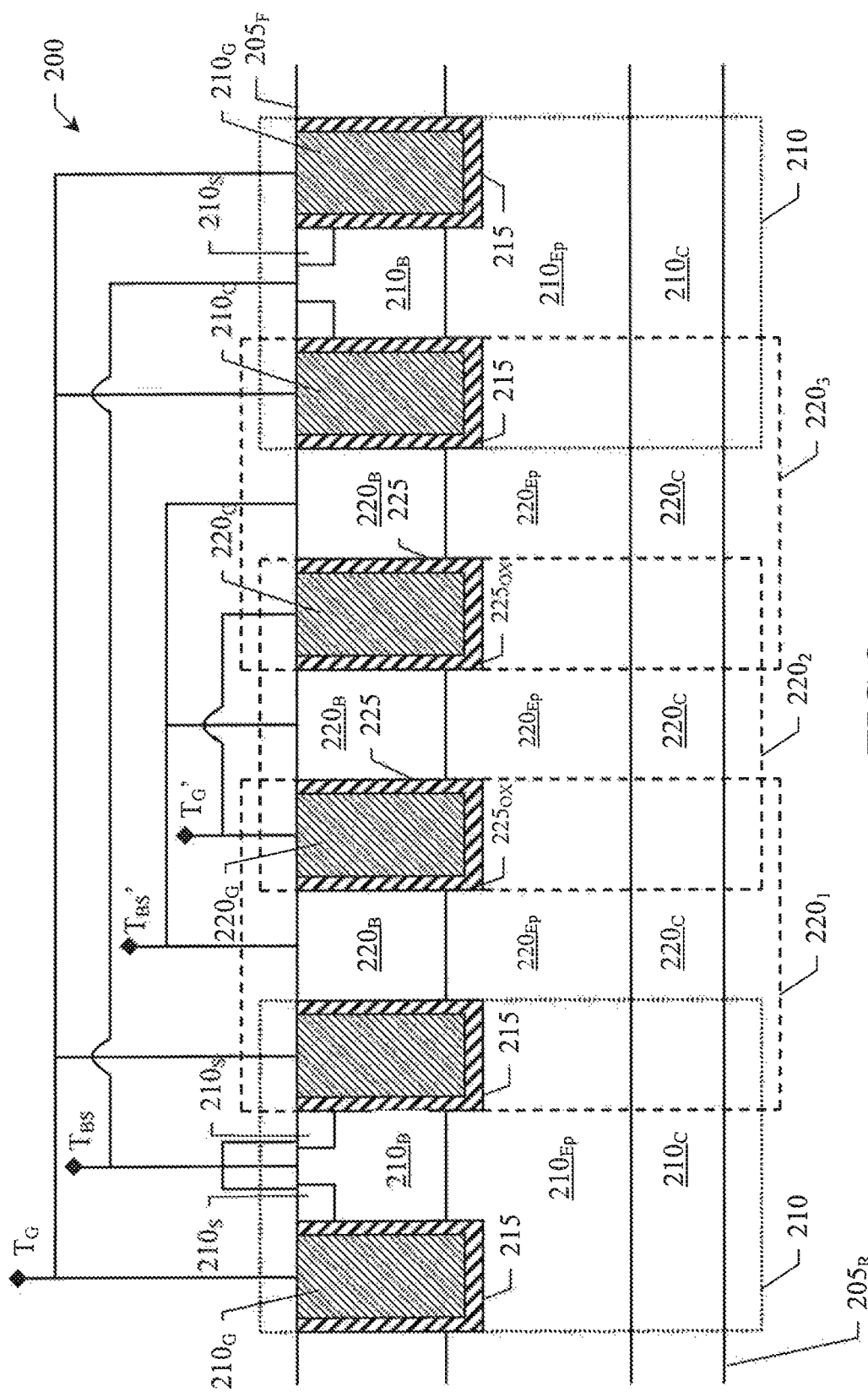
FIG. 2 schematically shows a sectional view of an electronic device known in the state of the art.

With reference now to FIG. 2, it schematically shows a sectional view of an electronic device 200 known in the art.

The electronic device 200 comprises a plurality of IGBT transistors, which are arranged in cells 210, in the following active cells (only two shown in the figure for the sake of illustration ease). Each active cell 210 comprises two gate structures $210_G$, 215, $215_{OX}$, an emitter region $210_B$, $210_S$ interposed therebetween (each one comprising a body region $210_B$, and two source regions $210_S$ in the body region $210_B$, each one associated to a respective gate structure $210_G$, 215, $215_{OX}$), an epitaxial region $210_{Ep}$ and a collector region $210_C$.

Each active cell 210 is made in form of strip (not visible) extending substantially along the entire length of the electronic device 200, with the emitter regions $210_B$, $210_S$ and the gate regions $210_G$ of all the (strips of) active cells 210 that are connected to an emitter terminal $T_{BS}$ and to a gate terminal $T_G$, respectively, of the electronic device 200—thus making a parallel connection between the active cells 210.

The electronic device 200 further comprises one or more dummy cells $220_i$ (i=1, 2, . . . N, with N=3 in the example at issue) between consecutive active cells 210.

Each dummy cell $220_i$ comprises a dummy epitaxial region $220_{Ep}$, a dummy collector region $220_C$, and a dummy emitter region $220_B$ (similar to the epitaxial region $210_{Ep}$, the collector region $210_C$ and the body region $210_B$, respectively). As shown in the figure, a number n of dummy gate structures $220_G$, 225, $225_{OX}$ (two in the example at issue, and in general n=N−1) are formed between the gate structures $210_G$, 215, $215_{OX}$ of consecutive active cells 210. In this way, the dummy cell $220_2$ comprises (and is limited by) the dummy gate structures $220_G$, 225, $225_{OX}$, whereas each dummy cell $220_1$, $220_3$ comprises (and is limited by) a respective gate structure $210_G$, 215, $215_{OX}$ and a respective dummy gate structure $220_G$, 225, $225_{OX}$.

The dummy emitter regions $220_B$ lack of source regions, so that the dummy cells $220_i$ do not implement the MOSFET element. As should be known, by appropriately driving the dummy cells $220_D$, controlled voltage changes can be induced so as to affect electrical parameters of the active cells 210 (for example, breakdown voltage, gain factor).

However, as discussed in the introductory part, the dummy cells $220_1$, $220_3$, as sharing the gate structures $210_G$, 215, $215_{OX}$ with the active cells 210 adjacent thereto, cannot be biased independently with respect to the active cells 210. This is conceptually represented in the figure by connection of the dummy emitter regions $220_B$ and of the dummy gate regions $220_G$ to a dummy emitter terminal $T_{BS}$' and to a dummy gate terminal $T_G$', respectively—with the exception of the gate regions $210_G$ (which, although associated with the dummy cells $220_1$, $220_3$, should be driven according to the operation of the active cells 210).

Additionally, the dummy cells $220_1$, $220_3$ introduce capacitive couplings between the dummy emitter and dummy collector regions $220_B$, $220_C$ and the gate region $210_G$ of the active cells 210 adjacent thereto. Such capacitive couplings determine a reduction of the switching speed of the electronic device 200.

Figure 3:
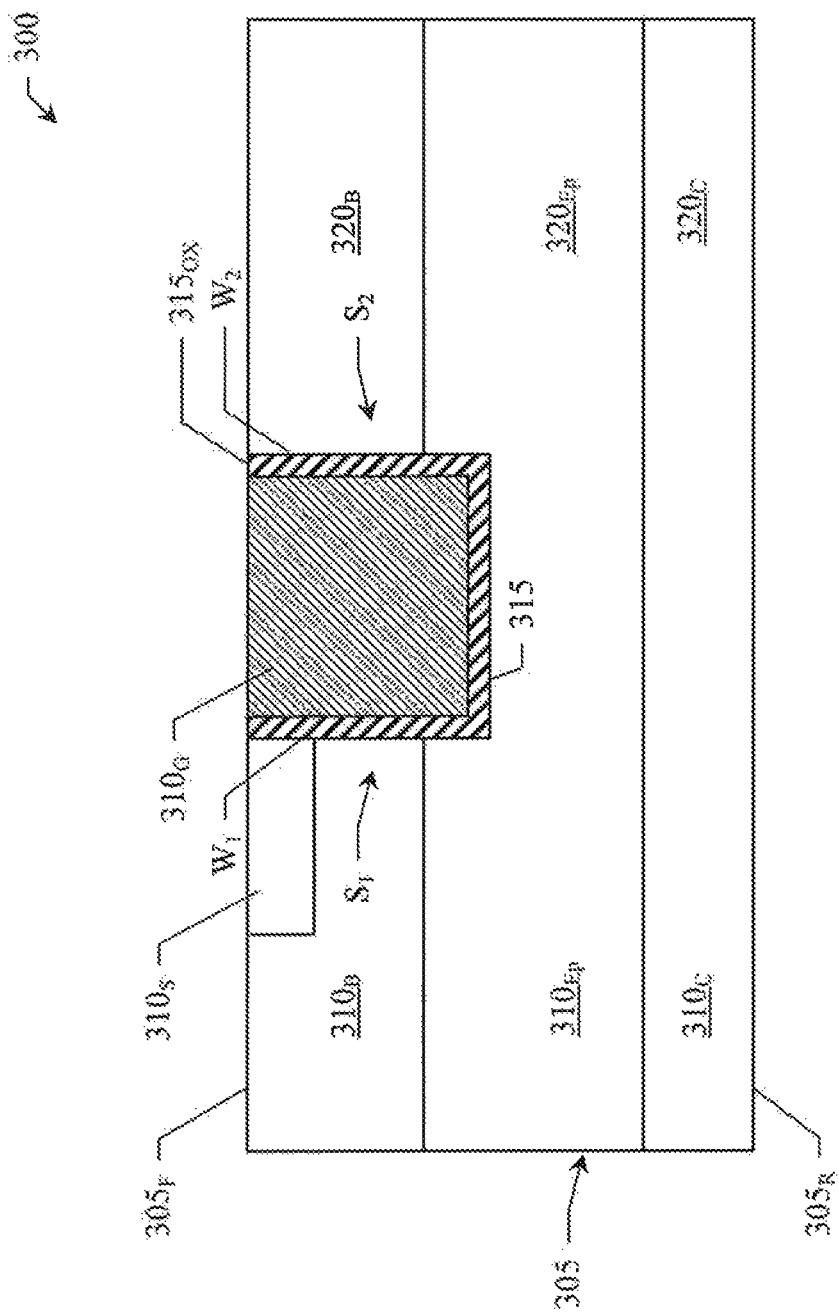
FIG. 3 schematically shows a sectional view of an electronic device wherein the solution according to one or more embodiments may be applied.

It is noted that the drawbacks of above (pointed out in relation to the specific cells configuration) are common to all configurations that comprise the structure shown in the sectional view of FIG. 3. This structure may be used (for example, replicated and/or adapted) to obtain the electronic device 200 (or electronic devices with different configurations), or it may individually give rise to a different (for example, power) electronic device—which in the following will be referred to as the electronic device 300.

As shown in the figure, the electronic device 300 comprises an epitaxial region $310_{Ep}$ extending from the front surface $305_F$ of the chip 305 (a portion of the chip between the rear surface $305_R$ and the epitaxial region $310_{Ep}$ defining a collector region $310_C$), and a gate structure $310_G$,315, $315_{OX}$ extending from the front surface $305_F$ in the epitaxial region $310_{Ep}$.

The electronic device 300 further comprises a body region $310_B$ extending in the epitaxial region $310_{Ep}$ from the front surface $305_F$ at a side $S_1$ of the trench 315 (facing the side wall $W_1$), and a source region $310_S$ extending in the body region $310_B$ from the front surface $305_F$ at the trench 315—as before, the electronic device 300 thus implements an IGBT transistor at the side $S_1$. At a side $S_2$ of the trench 315 opposite the side $S_1$ (and facing the side wall $W_2$) there is provided a conductive region $320_B$ structurally analogous to the body region $310_B$ (and also extending in the epitaxial region $310_{Ep}$ from the front surface $305_F$), but without the source region $310_S$. Such conductive region $320_B$ may be used (as before) for implementing a dummy emitter region (with the portions of chip 305 below the dummy emitter region $320_B$ that define the dummy epitaxial $320_{Ep}$ and dummy collector $320_C$ regions).

Figure 4:
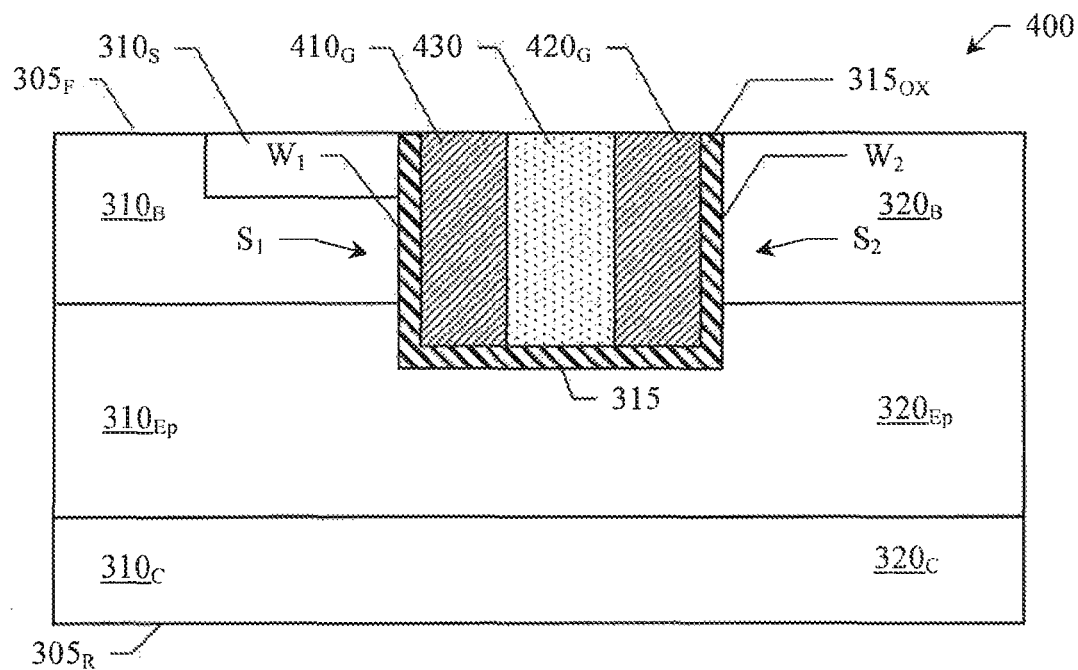
FIG. 4 schematically shows a sectional view of an electronic device according to an embodiment.

With reference to FIG. 4, it schematically shows a sectional view of an electronic device 400 according to an embodiment.

Unlike the former devices, the electronic device 400 comprises a gate region $410_G$ extending along the side wall $W_1$ of the trench 315 (facing the body region $310_B$), and a dummy gate region $420_G$ formed in the same trench 315, electrically isolated from the gate region $410_G$ (for example, by interposition of a dielectric region 430) and extending along the side wall $W_2$ of the trench 315 (facing the dummy emitter region $310_B$).

In this way, the dummy gate region $420_G$ (associated with the dummy element) can be driven independently with respect to the gate region $410_G$ (associated with the IGBT transistor). Moreover, as being the IGBT transistor substantially isolated from the dummy element, the electronic device 400 does not feature the capacitive couplings between the dummy body $320_B$ and the dummy collector $320_C$ regions and the gate region $410_G$ that, in the known solutions, determine degradation of performance (for example, switching speed).

In the illustrated embodiment, the gate region $410_G$, the dummy gate region $420_G$ and the dielectric region 430 occupy each one about one third of the trench—however, this should not to be construed as a limitation as other proportions are possible for meeting specific design requirements.

Figure 5:
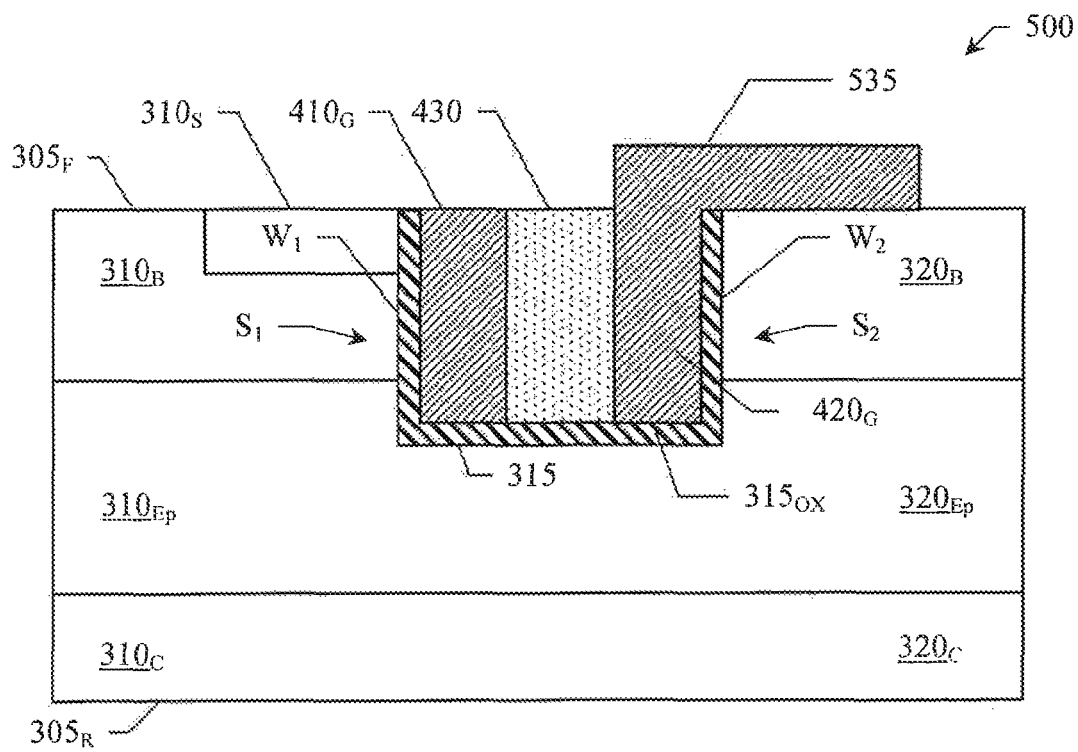
FIG. 5 schematically shows a sectional view of an electronic device according to another embodiment, and FIGS. 6A-6D schematically show some significant steps of the production process of the electronic device of FIG. 5 according to an embodiment.

Turning to FIG. 5, it schematically shows a sectional view of an electronic device 500 according to another embodiment. Compared to the previous solution, the electronic device 500 comprises a contact portion 535 (or more of it) of conductive material that extends on the front surface $305_F$ for contacting the dummy gate region $420_G$ to the dummy emitter region $320_B$ (so as to be driven together).

Advantageously, the contact portion 535 is of the same material as the gate region $410_G$ and the dummy gate region $420_G$ (for example, polycrystalline silicon, possibly $N^+$-doped polycrystalline silicon).

The described solution is particularly advantageous when used for making complex configurations (such as the cells configuration described above). As will be understood, in this case the dummy emitter regions (or a part thereof), as they may be connected directly to the respective dummy gate regions, allow making an electronic device that requires a small number of metals and low-complexity fingering.

FIGS. 6A-6D schematically show some significant steps of the production process of the electronic device 500 according to an embodiment.

Figure 6A:
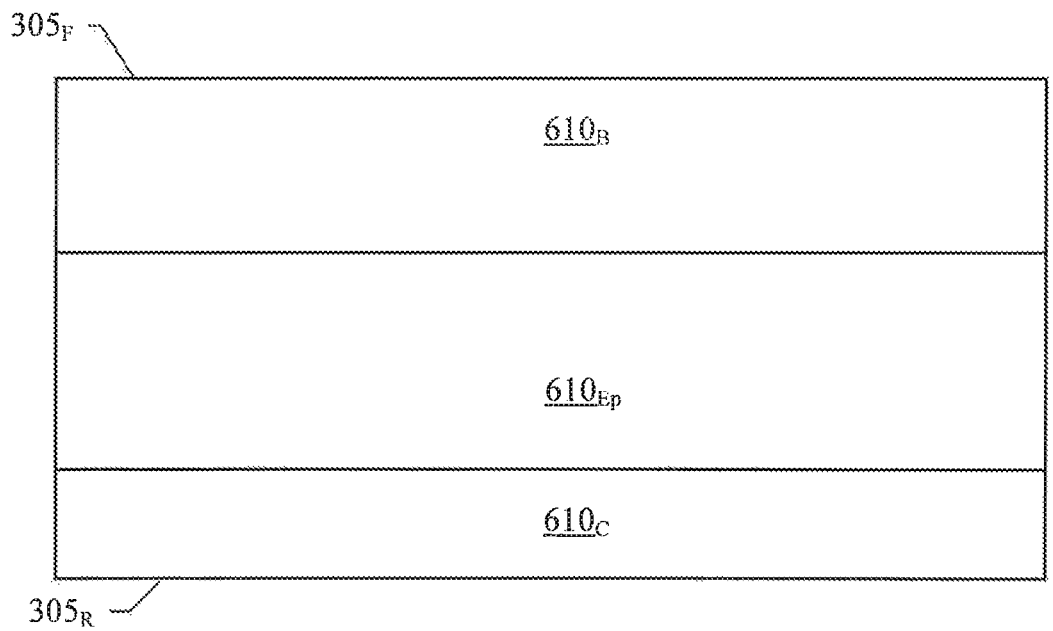
Figure 6B:
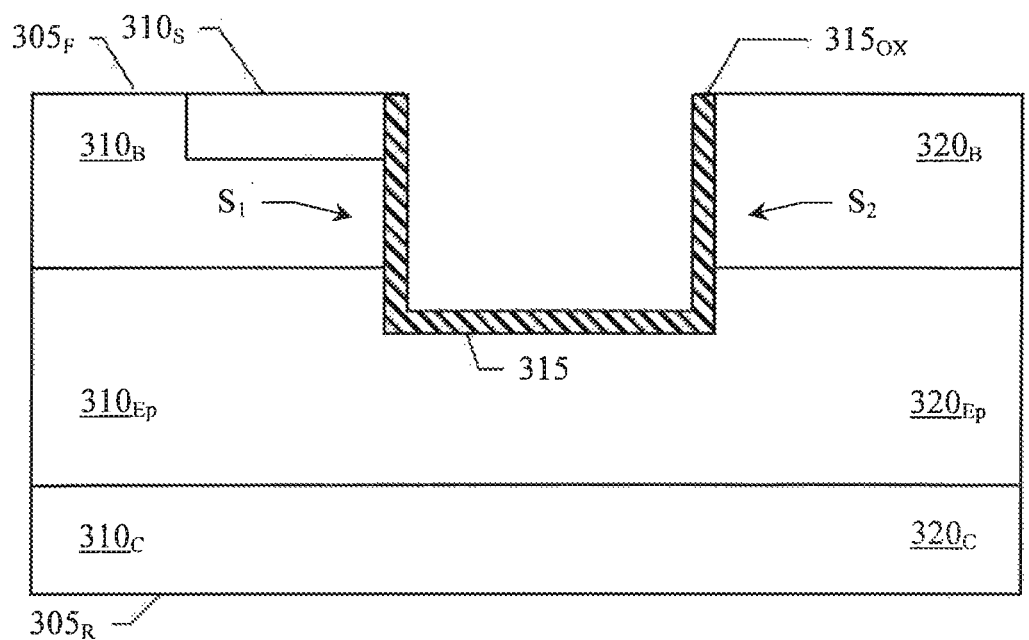

For the sake of description ease, these steps will be discussed starting from the structure shown in FIG. 6A, which comprises a collector layer 610, an epitaxial layer $610_{Ep}$ and a body layer $610_B$ (for example obtained in a known manner by ionic implantation processes).

Then (FIG. 6B), the trench 315 is formed (for example, by an etching process) in the epitaxial layer $610_{Ep}$ through the body layer $610_B$ (which trench 315 defines, "and delimit", the collector $310_C$ and dummy collector $320_C$ regions, the epitaxial $310_{Ep}$ and dummy epitaxial $320_{Ep}$ regions and the body $310_B$ and dummy emitter $320_B$ regions), the oxide layer $315_{OX}$ is formed on the side walls $W_1$, $W_2$ and on the bottom of the trench 315 (for example, by a growth process), and the source region $310_S$ is formed in the body region $310_B$ (for example, by a corresponding ionic implantation process).

Figure 6C:
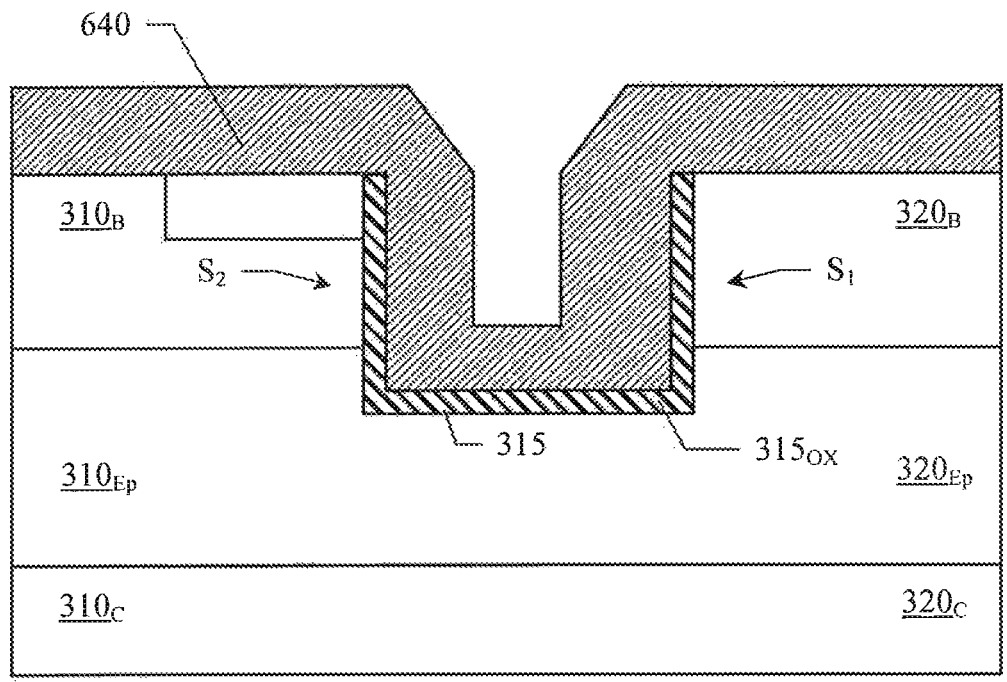

With reference to FIG. 6C, the production process goes on with the deposition of a conductive layer 640 (for example, of $N^+$-doped polycrystalline silicon) on the front surface $305_F$ and on the oxide layer $315_{OX}$. Advantageously, the conductive layer 640 has such a thickness to follow the profile of the trench 315 without filling it completely (so as to facilitate the subsequent processes). For this purpose, any controlled deposition process may be used (for example, chemical vapor deposition).

Figure 6D:
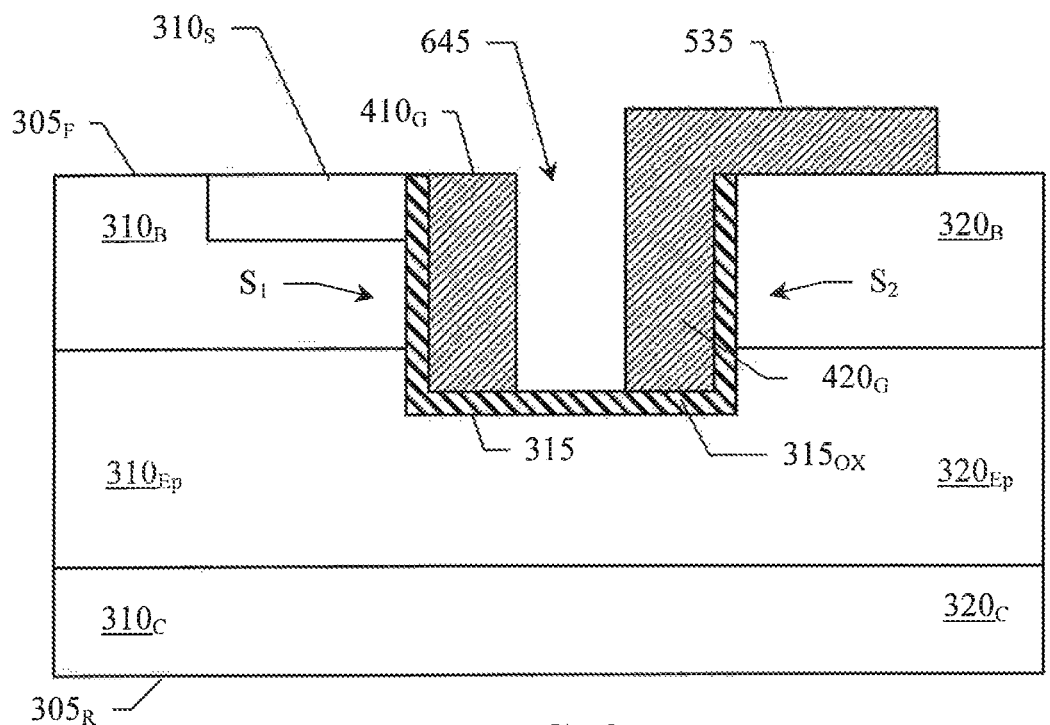

Then, a photo-resist mask, not shown, is formed on the conductive layer 640 by photo-lithographic technique, which is followed by an anisotropic dry etching operation. The result of this operation is shown in FIG. 6D, with the removal of the conductive layer 640 from the front surface $305_F$ (with the exception of portions of the conductive layer 640 protected by the mask, which form the contact portions 535), from the portion of oxide layer $315_{OX}$ on the bottom wall of the trench 315, and with the definition of the gate region 410$_G$, of the dummy gate region 420$_G$ and of a cavity 645 interposed therebetween.

At this point, the cavity 645 is filled with a dielectric material (e.g., silicon dioxide) to form the dielectric region 430 (thereby obtaining the electronic device of FIG. 5). This can be achieved through selective processes, or through non-selective processes followed by selective removal. In order to achieve uniformity and optimal dielectric properties, the dielectric region 430 can be obtained from a deposition of silicon tetraorthosilicate (TEOS) at high temperatures (e.g., between 650° C. and 750° C.) and low pressures.

At this point, the production process ends, in a known manner, with the making of the metal layers for providing interconnections (steps not shown).

As will be understood, the production process, described with reference to the electronic device of FIG. 5, can be applied in a similar manner for manufacturing more complex electronic devices (for example, by replicating the structure of FIG. 5 to obtain cells and/or strips of cells configurations).

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, ordinal qualifiers or the like are merely used as labels for distinguishing elements with the same name but do not connote any priority, precedence or order. Moreover, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, an embodiment proposes a power electronic device integrated in a chip of semiconductor material of a first type of conductivity. The electronic device comprises an epitaxial region of a second type of conductivity extending into the chip from a front surface of the chip, a portion of the chip between a rear surface of the chip opposite the front surface and the epitaxial region defining a collector region. The electronic device also comprises a gate region of conductive material in a trench extending into the epitaxial region from the front surface, and an emitter region extending into the epitaxial region from the front surface at a first side of said trench. The emitter region comprises a body region of the first type of conductivity extending into the epitaxial region from the front surface, and a source region of the second type of conductivity extending into the body region from the front surface at said trench. The electronic device further comprises a dummy emitter region of the first type of conductivity extending into the epitaxial region from the front surface at a second side of said trench opposite said first side. The dummy emitter region lacks of said source region. The gate region extends along a first wall of the trench facing the emitter region. A dummy gate region is formed in said trench. The dummy gate region is electrically isolated from said gate region and extends along a second wall of the trench opposite said first wall.

Anyway, similar considerations apply if the electronic device has a different structure or comprises equivalent components (both separated and combined together, in whole or in part). For example, nothing prevents from making reversed doping (for example, for implementing a P-channel MOSFET element and a NPN BJT element); moreover, the values of dopant concentrations indicated in the description are understood to be exemplary, as they can be suitably modified, by a manufacturer, according to technical or specific considerations.

Furthermore, relative or absolute size, as indicated or deductible, of the various layers and/or regions of the electronic device are merely indicative (and may vary according to technological advancements compared to the current state of the art), as well as the relationship between the respective dopant concentrations.

According to an embodiment, the electronic device further comprises at least one contact portion of conductive material extending on the front surface of the chip for contacting the dummy gate region to the dummy emitter region.

The contact portion may have extension in plan view (and/or in depth) different from that being shown. In particular, it may extend on part (as shown) or all of the dummy emitter region. In embodiments wherein different adjacent dummy emitter regions are provided (as in the cells implementation), there may be multiple contact portions, or a single contact portion that contacts them simultaneously.

According to an embodiment, the gate region, the dummy gate region and the contact portion comprise polycrystalline silicon.

Anyway, the gate region, the dummy gate region and the contact portion can be made by different conductive materials, or by differently-doped polycrystalline silicon.

It should be understood that the design of the electronic device may also be created in a programming language; in addition, if the designer does not manufacture the corresponding integrated devices or masks, the design may be transmitted by physical means to others. In any case, the resulting integrated circuit may be distributed by its manufacturer in raw wafer form, as a bare die, or in packages. Moreover, the structure may be integrated with other circuits in the same chip, or it may be mounted in intermediate products (such as mother boards) and coupled with one or more other chips (such as a processor).

Another aspect of the solution according to an embodiment proposes a method for integrating a power electronic device in a chip of semiconductor material of a first type of conductivity. The method comprises forming an epitaxial layer of a second type of conductivity extending into the chip from a front surface of the chip and comprising an epitaxial region, a portion of the chip between a rear surface of the chip opposite the front surface and the epitaxial layer defining a collector layer comprising a collector region. The method further comprises forming a body layer of the first type of conductivity extending into the epitaxial layer from the front surface, forming a gate region of conductive material in a trench extending from the front surface into the epitaxial layer through the body layer, and forming a source region of the second type of conductivity extending into the body layer from the front surface at a first side of said trench. The source region and portions of the body layer delimited by said first side identify an emitter region, and portions of the body layer delimited by a second side of the trench opposite the first side identify a dummy emitter region. Said forming a gate region comprises forming the gate region along a first wall of the trench facing the emitter region. The method further comprises forming a dummy gate region in said trench, said dummy gate region being electrically isolated from said gate region and extending along a second wall of the trench opposite said first wall.

In any case, the solution according to an embodiment lends itself to be implemented through an equivalent method (by using similar steps, removing some non-essential steps, or adding additional optional steps); moreover, the steps may be performed in a different order, in parallel or overlapped (at least in part).

According to an embodiment, said forming a gate region and said forming a dummy gate region comprise forming a conductive layer on the front surface of the chip, and on the first wall, on the second wall and on a bottom wall of the trench, and performing an etching operation to remove part of the conductive layer on the first wall and on the second wall thereby defining the gate region and the dummy gate region, and to remove the conductive layer on the bottom wall thereby defining a cavity between the gate region and the dummy gate region.

According to an embodiment, the method further comprises depositing a dielectric material into the cavity for electrically isolating the gate region from the dummy gate region.

Anyway, such step may be omitted in a basic implementation.

According to an embodiment, the method further comprises forming at least one contact portion of conductive material extending on the front surface of the chip for contacting the dummy gate region to the dummy emitter region.

Anyway, this step may be omitted in a basic implementation. For example, contact between the dummy gate region and the dummy emitter region may be made by metal layers.

According to an embodiment, said performing an etching operation comprises removing portions of the conductive layer on the front surface to form said at least one contact portion.

Although explicit reference to an anisotropic dry etching has been made in description, this should not be understood as a limitation on the process used. In addition, the contact portion may be obtained in a separate manner with respect to the gate region and the dummy gate region (for example, from a different conductive layer).

What is claimed is:

1. A method for integrating a power electronic device in a chip of semiconductor material of a first type of conductivity, comprising:
    forming an epitaxial layer of a second type of conductivity extending into the chip from a front surface of the chip and comprising an epitaxial region, a portion of the chip between a rear surface of the chip opposite the front surface and the epitaxial layer defining a collector layer comprising a collector region,
    forming a body layer of the first type of conductivity extending into the epitaxial layer from the front surface,
    forming a gate region of conductive material in a trench extending from the front surface into the epitaxial layer through the body layer,
    forming a source region of the second type of conductivity extending into the body layer from the front surface at a first side of said trench, wherein the source region and portions of the body layer delimited by said first side identify an emitter region, and portions of the body layer delimited by a second side of the trench opposite the first side identify a dummy emitter region,
    wherein forming the gate region comprises forming the gate region along a first wall of the trench facing the emitter region, and
    forming a dummy gate region in said trench, said dummy gate region being electrically isolated from said gate region and extending along a second wall of the trench opposite said first wall.

2. The method according to claim 1, wherein said forming a gate region and said forming a dummy gate region comprise
    forming a conductive layer on the front surface of the chip, and on the first wall, on the second wall and on a bottom wall of the trench, and
    performing an etching operation to remove part of the conductive layer on the first wall and on the second wall thereby defining the gate region and the dummy gate region, and to remove the conductive layer on the bottom wall thereby defining a cavity between the gate region and the dummy gate region.

3. The method according to claim 2, further comprising depositing a dielectric material into the cavity for electrically isolating the gate region from the dummy gate region.

4. The method according to claim 2, further comprising forming at least one contact portion of conductive material extending on the front surface of the chip for contacting the dummy gate region to the dummy emitter region.

5. The method according to claim 4, further comprising performing an etching operation to removing portions of a conductive layer on the front surface to form said at least one contact portion.

6. A method, comprising:
    forming a trench in a front surface of a substrate;
    depositing an insulating liner on the walls and floor of the trench;
    depositing a conductive gate electrode material within the trench;
    dividing the conductive gate electrode material within the trench into a first conductive gate portion along a first wall and a first portion of the floor within said trench and a second conductive gate portion along a second wall and a second portion of the floor within said trench;
    depositing an insulating portion within the trench electrically isolating the first conductive gate portion from the second conductive gate portion.

7. The method of claim 6, further comprising forming a source region in the front surface of the substrate adjacent the insulating liner of said trench and said first conductive gate portion.

8. The method of claim 6, wherein dividing further comprises extending the second conductive gate portion outside of said trench along the front surface of the substrate.

9. The method of claim 6, further comprising connecting the first conductive gate portion as a gate electrode of an IGBT and connecting the second conductive gate portion as a dummy gate electrode.

10. A method, comprising:
forming an epitaxial layer of a second type of conductivity over a layer of semiconductor material of a first type of conductivity;
forming a body layer of the first type of conductivity on the epitaxial layer;
forming a trench extending through the body layer and partially into the epitaxial layer;
forming a source region of the second type of conductivity extending into the body layer at a first side of said trench;
lining side walls and a bottom of the trench with an insulating liner;
forming a gate region of conductive material in said trench along a first side wall facing the source region;
forming a dummy gate region of conductive material in said trench along a second side wall opposite the first side wall;
filling the trench with insulating material to electrically isolate the gate region from the dummy gate region.

11. The method of claim 10, wherein the source region and portions of the body layer near the first side wall provide an emitter region, and portions of the body layer near the second side wall provide a dummy emitter region.

12. The method of claim 11, wherein forming the gate region comprises forming the gate region along the first wall of the trench facing the emitter region.

13. The method of claim 11, further comprising forming at least one contact portion of conductive material extending on the front surface of the chip for electrically connecting the dummy gate region to the dummy emitter region.

14. The method of claim 13, further comprising depositing a layer of conductive material and etching the layer of conductive material to form the gate region and dummy gate region.

15. The method of claim 10, wherein the insulating material is a dielectric material.

\* \* \* \* \*